(12) United States Patent
Farooq et al.

(10) Patent No.: US 6,216,324 B1
(45) Date of Patent: Apr. 17, 2001

(54) METHOD FOR A THIN FILM MULTILAYER CAPACITOR

(75) Inventors: Mukta S. Farooq; Shaji Farooq, both of Hopewell Junction; Harvey C. Hamel, Poughkeepsie; John U. Knickerbocker, Hopewell Junction; Robert A. Rita; Herbert I. Stoller, both of Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/382,536

(22) Filed: Aug. 25, 1999

Related U.S. Application Data

(62) Division of application No. 09/031,235, filed on Feb. 26, 1998, now Pat. No. 6,023,407.

(51) Int. Cl.⁷ .................................................. H01G 4/002
(52) U.S. Cl. .................................... 29/25.42; 438/396
(58) Field of Search ........................... 361/301.1, 301.4, 361/306.1, 306.3, 311; 438/396; 29/25.01, 25.41, 25.42

(56) References Cited

U.S. PATENT DOCUMENTS

| | | |
|---|---|---|
| 2,389,420 | 11/1945 | Deyrup . |
| 4,374,159 | 2/1983 | Pitetti et al. . |
| 4,572,843 | 2/1986 | Saito et al. . |
| 4,615,908 | 10/1986 | Behn et al. . |
| 4,954,926 | 9/1990 | Pepin . |
| 5,134,246 | 7/1992 | Beppu et al. . |
| 5,326,016 | 7/1994 | Cohen et al. . |
| 5,598,131 | 1/1997 | Mazzochette . |
| 5,640,699 | 6/1997 | Ralph . |

Primary Examiner—Charles Bowers
Assistant Examiner—Evan Pert
(74) Attorney, Agent, or Firm—DeLio & Peterson, LLC; Robert Curcio; Aziz M. Ahsan

(57) ABSTRACT

An electronic component structure is proposed, wherein an interposer thin film capacitor structure is employed between an active electronic component and a multilayer circuit card. A method for making the interposer thin film capacitor is also proposed. In order to eliminate fatal electrical shorts in the overlying thin film regions that arise from pits, voids, or undulations on the substrate surface, a thick first metal layer, on the order of 0.5–10 mm thick, is deposited on the substrate upon which the remaining thin films, including a dielectric film and second metal layer, are then applied. The first metal layer is comprised of Pt or other electrode metal, or a combination of Pt, Cr, and Cu metals, and a diffusion barrier layer. Additional Ti layers may be employed for adhesion enhancement. The thickness of the first metal layers are approximately: 200 Å for the Cr layer; 0.5–10 mm for the Cu layer; 1000 Å–5000 Å for the diffusion barrier; and 100 Å–2500 Å for a Pt layer.

36 Claims, 4 Drawing Sheets

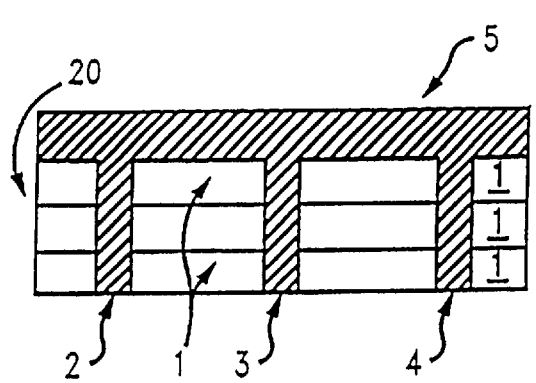
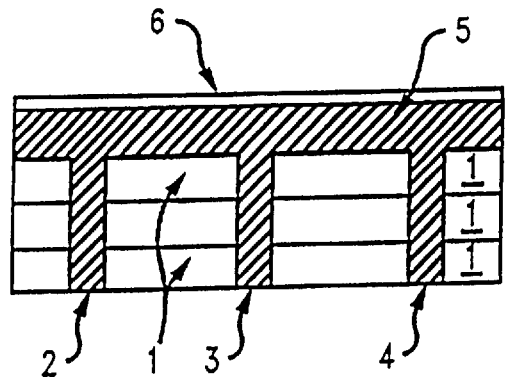
FIG. 1    FIG. 2
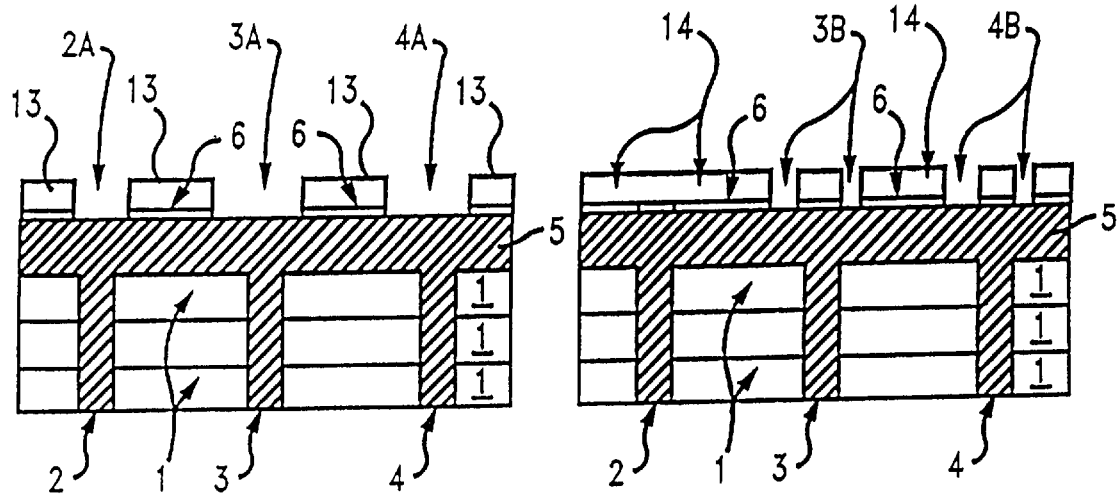
FIG. 3    FIG. 4

METHOD FOR A THIN FILM MULTILAYER CAPACITOR

This application is a divisional of Ser. No. 09/031,235 filed Feb. 26, 1998 now U.S. Pat. No. 6,023,407.

BACKGROUND OF THE INVENTION

1. Field of the Invention

The present invention relates to multilayer electronic components and, in particular, to thin film multilayer capacitors and a method for making the same.

2. Description of Related Art

Multilayer substrates with capacitors have found widespread use in electronics as integrated circuit packages. Multilayer capacitors consist of a plurality of interleaved and staggered layers of an electrically conductive film of metal and electrically insulating layers of a ceramic oxide (dielectric). Such capacitors are well known in the art. For example, U.S. Pat. No. 2,389,420 issued to A. J. Deyrup on Nov. 20, 1945, entitled, "MANUFACTURE OF CAPACITORS", describes the structure, manufacture, and properties of monolithic multilayer ceramic capacitors.

Typically, multilayer ceramic capacitors are manufactured by building up an interleaved configuration of metal electrodes and ceramic layers, dicing individual parts out of the build-up, then subjecting the parts to a slow burnout and then higher temperature firing.

A capacitor structure can alternatively be formed by using thin films of electrodes and dielectrics which are deposited on a prefabricated multilayer substrate. Typically, the bottom electrode is deposited using such techniques as sputter deposition, evaporation, chemical vapor deposition, or sol-gel.

The dielectric is deposited using a plasma or chemical vapor deposition method (PVD or CVD), or other method such as a spin-on technique. An example of films applied wet is a sol-gel film or other organic medium film which is heat treated leaving the inorganic dielectric component. The dielectric film may require one or more heat treatments in a specific ambient such as an oxidizing atmosphere to arrive at the desired stoichiometries. An example of a dielectric film is barium titanate (BT), barium strontium titanate (BST), or barium zirconate titanate (BZT). These films can be deposited using a sputter deposition technique which employs an appropriate target in the presence of argon plasma, metallorganic chemical vapor deposition (MOCVD), or sol-gel processing.

The dielectric film may then be patterned using a resist stencil and dry or wet etching methods. The final step is to put down a top electrode, which is typically selected from a similar list of materials used for the bottom electrode.

It is desirable to have the thin film capacitor reside on a ceramic substrate so that the metalized vias can be made to cleanly pass through the layered capacitor.

An interposer thin film capacitor fabricated on a multilayer ceramic substrate base has through vias, typically for ground, power, and signal connections. The interposer capacitor is located between the integrated circuit (IC) chip and the substrate, typically providing decoupling capacitance for the IC lines.

In building a thin film capacitor structure on a ceramic interposer, the ceramic surface defects such as voids, pits, and undulations often create fatal shorts in the overlying thin film regions. Typically, the shorts arise because the films are extremely thin, on the order of 1000 A for an adhesion or barrier layer, 1000 A for a Pt electrode, 1000 A–2500 A for a high k dielectric, and 1000 A for a top Pt electrode. Further, conventional void filling approaches such as polymer fill cannot be used because the subsequent high temperature anneal required for dielectric film optimization is sufficient to severely degrade and possibly destroy the polymer used to fill the voids.

Thick film structures do not share this deficiency. Using standard thick film print and fire assembly techniques, a metal paste (typically gold) 8–12 $\mu$m thick covers the substrate top surface to form a first trace for a metal electrode. This thick metal trace fills unwanted voids. In U.S. Pat. No. 5,640,699 issued to Ralph on Jun. 17, 1997, entitled, "MIXER CONSTRUCTED FROM THICK FILM BALANCED LINE STRUCTURE", a thick first metal layer deposited on the substrate base begins the fabrication of a standard circuit cell. However, thin film constructions, especially dielectric materials with edge coupled lines requiring tight tolerances and exacting construction, do not lend themselves to automated manufacturing techniques or surface mount assembly techniques commonly used for thick film structures.

Bearing in mind the problems and deficiencies of the prior art, it is therefore an object of the present invention to provide a multilayer electronic component containing thereon a thin film capacitor.

It is another object of the present invention to provide a method for forming a thin film multilayer interposer capacitor removed of shorts caused by substrate defects.

Still other objects of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an electronic component structure comprising: an electronic component with conductive leads; a multilayer substrate with a top surface, the substrate comprising a plurality of layers having therein metalized circuitry, and interconnecting metalized vias; a thin film structure with a top surface, a bottom surface opposite the top surface, and interconnecting metalized vias, such that the vias at the bottom surface are electrically connected to the interconnecting metalized vias of the multilayer substrate, and the vias at the top surface are electrically connected to the electronic component conductive leads, the thin film structure containing at least one capacitor comprising: at least one patterned, lower first structure layer on the top surface of the thin film structure comprising of a first conductive material, such that the conductive material is deposited at a thickness greater than 0.5 $\mu$m; a dielectric layer; and an upper, second structure layer over the dielectric comprising of a second conductive material.

The electronic component structure may also have a patterned, lower first structure that is a metal layer of a thickness greater than or equal to 2 $\mu$m. Additionally, the patterned, lower first structure may comprise: a layer of Cr; a layer of Cu; a diffusion barrier layer; a layer of Pt; and an optional layer of Ti for adhesion enhancement.

The thin film dielectric layer is comprised of a high dielectric constant material which may comprise: barium strontium titanate; barium titanate; barium zirconate titanate; lead lanthanum zirconate; lead zirconate titanate; or, tantalum oxide.

The present invention is directed to, in a second aspect, an electronic component structure comprising: an electronic component with conductive leads; a multilayer substrate with a top surface, the substrate comprising a plurality of layers having therein metallized circuitry, and interconnecting metalized vias; a thin film structure with a top surface, a bottom surface opposite the top surface, and interconnecting metalized vias, such that the vias at the bottom surface are electrically connected to the interconnecting metalized vias of the multilayer substrate, and the vias at the top surface are electrically connected to the electronic component conductive leads, the thin film structure containing at least one capacitor comprising: at least one patterned, lower first structure layer on the top surface of the thin film structure comprising of a first conductive material, such that the first conductive material is deposited at a thickness greater than 0.5 $\mu$m; at least one patterned, upper second structure layer comprising of a second conductive material, the second structure layer thinner than the first structure layer; a thin film dielectric between the first and second structure layers; a cured, first polyimide layer on portions of the top surface of the thin film structure, between openings of the patterned first structure layer, over a portion of the dielectric, and underneath portions of the patterned second structure layer; a cured, second polyimide layer over a portion of the patterned, second structure layer; and conductive leads attaching the thin film structure interconnecting metalized vias on the thin film structure top surface to a portion of the electronic component leads, and attaching the thin film structure interconnecting metalized vias on the thin film structure bottom surface to a portion of the multilayer substrate interconnecting vias.

The first and second polyimide layers of this invention may comprise photosensitive polyimide. The patterned, upper second structure comprises: a layer comprised of: Pt, Cr, Cu; an electroplated layer of Cu and Ni; and an electroplated layer of Au. The vias exposed at the top surface and the bottom surface of the thin film structure further include solder balls for joining the thin film structure to the multilayer substrate.

In a third aspect, a method for fabricating a thin film multilayer capacitor is taught, comprising:

a) providing a multilayer substrate with a top surface, a bottom surface opposite the top surface, and conductive vias between the top and bottom surfaces;

b) depositing a first metal layer on the top surface such that the first metal layer is deposited at a thickness greater than 0.5 $\mu$m;

c) depositing a thin film dielectric on the first metal layer;

d) patterning the thin film dielectric;

e) applying a first patterned polyimide layer such that, when a portion of the patterned polyimide layer is subtracted, polyimide insulation structures remain on the top surface adjacent the conductive vias; and f) depositing a second metal layer.

The method further comprises: applying a second patterned polyimide layer; laser ablating the second polyimide layer in areas over the vias; and depositing solder balls to the top surface of the multilayer substrate on the exposed vias, and to the bottom surface of the multilayer substrate on the vias.

Depositing a first metal layer further includes depositing a combination of Cr at approximately 200 A thick, Cu at approximately 0.5 to 10 $\mu$m thick, a diffusion barrier at approximately 1000 A–5000 A thick, and Pt at approximately 100 A to 2500 A thick.

In a fourth aspect, a method for fabricating a thin film multilayer capacitor is taught, comprising:

a) providing a multilayer substrate with a top surface, a bottom surface opposite the top surface, and conductive vias between the top and bottom surfaces;

b) depositing a blanket first level metal structure on the top surface at a thickness of at least 0.5 $\mu$m;

c) depositing a thin film dielectric on the first level metal structure;

d) annealing the multilayer substrate including the first level metal structure and the dielectric film;

e) applying a first photoresist stencil over the dielectric film such that the stencil patterns areas over the conductive vias on the top surface of the multilayer substrate;

f) removing a portion of the thin film dielectric and a portion of the first level metal structure in the exposed areas over the conductive vias on the top surface of the multilayer substrate;

g) applying a first patterned polyimide layer such that, when a portion of the patterned polyimide layer is subtracted, polyimide insulation structures remain on the top surface, adjacent the conductive vias;

h) depositing a second level metal structure;

i) removing a portion of the second level metal structure;

j) applying a second polyimide layer;

k) laser ablating the second polyimide layer in areas over the vias; and l) depositing solder balls to the top surface of the multilayer substrate on the exposed vias, and to the bottom surface of the multilayer substrate on the vias.

Additionally, in step (c) of this fourth aspect, depositing a thin film dielectric, a dielectric film is deposited at approximately 500 A to 3000 A thick using a chemical vapor deposition process or a plasma vapor deposition process. In step (d), annealing the multilayer substrate, annealing is performed at a temperature range of approximately 650° C. to 750° C. for one hour in one of the following atmospheres: air, oxygen, or nitrogen. Also, the removal of a portion of the thin film dielectric and a portion of the first level metal structure further includes using ion beam milling with the first photoresist stencil as a mask such that the dielectric, the Pt layer, and the diffusion barrier are removed. The photoresist is stripped away using a wet media including strippers or acetone, or using a dry media including $O_2$ or Ar ion beam milling. Also, in step (g), applying a patterned polyimide layer, a second photoresist stencil is used such that, when exposed and developed, the second photoresist stencil exposes areas adjacent the conductive vias. Applying a patterned polyimide layer, may also comprise using either a photosensitive or non-photosensitive polyimide to pattern the polyimide layer.

In step (h), depositing a second level metal structure comprises: 1) depositing a top surface metal (TSM) seed layer; 2) applying a resist stencil to pattern the seed layer; and 3) electroplating a metal layer on areas exposed by the resist stencil of step (2). In step (3), electroplating a metal layer, electroplating of Cu and Ni layers is performed.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 is a cross-sectional view of a layered substrate with metalized vias and a blanket metal layer deposited.

FIG. 2 is a cross-sectional view of the layered substrate of FIG. 1 with dielectric material applied.

FIG. 3 is a cross-sectional view of the layered substrate of FIG. 2 with a patterned photosensitive resist applied, and ion beam milling of the exposed high-k material.

FIG. 4 is a cross-sectional view of the layered substrate of FIG. 3 with a second patterned photosensitive resist applied, and ion beam milling of the exposed metal layer areas.

DESCRIPTION OF THE PREFERRED EMBODIMENT(S)

Figure 1A:
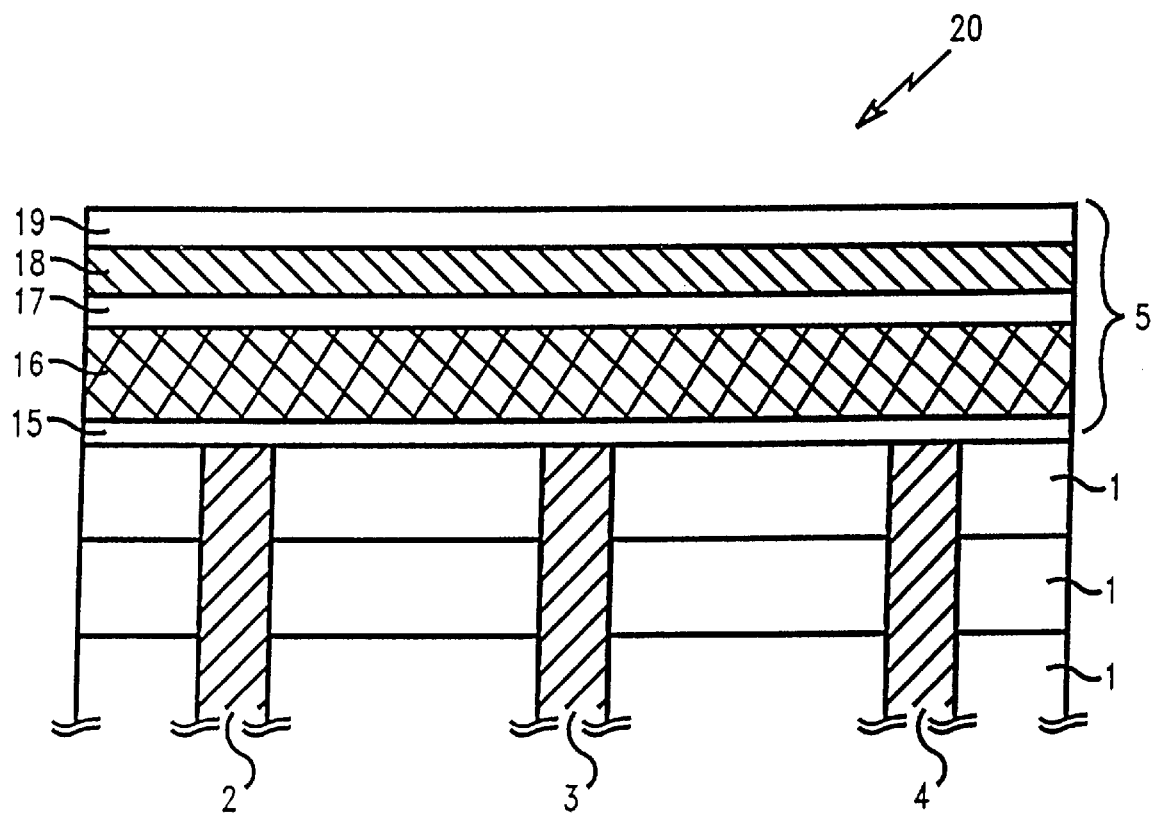
FIG. 1A is an expanded cross-sectional view of the layered substrate of FIG. 1, detailing the blanket metal layer.

In describing the preferred embodiment of the present invention, reference will be made herein to FIGS. 1–10 of the drawings in which like numerals refer to like features of the invention. Features of the invention are not necessarily shown to scale in the drawings.

An interposer thin film capacitor structure is proposed, where the capacitor resides on a substrate, preferably a ceramic substrate. The complications associated with building this structure are derived chiefly from the pitted, rough surface of the ceramic substrate. The ceramic substrate is advantageous for processing at higher temperatures. However, the process yield is jeopardized by excessive fatal shorts on the overlying thin film region initiated by the pitted ceramic surface. The process described herein alleviates this deficiency, resulting in a ceramic thin film capacitor resilient to thin film shorting.

Referring initially to FIG. 1, a multilayer ceramic structure 20 is shown, comprised of at least one ceramic sheet 1 and one or more interlayer conductive pads or vias which are filled with a conductive material, e.g., molybdenum, tungsten, copper, etc. In FIG. 1, the metal-filled vias are represented by ground line 2, power line 3, and signal-transmitting line 4.

Typically, multilayer circuit packages are constructed by combining ceramic particles and organic binders into unfired or "greensheet" tape. The green ceramic sheets are then punched, screened with metal paste, stacked together so that the punched holes are aligned, laminated under the influence of either or both temperature and pressure, and then sintered at a suitably high temperature in a controlled ambient environment.

The multilayer ceramic 20 is then surface treated (by lap, polish, chemical etch, etc.) in readiness for thin film deposition. A blanket metal layer 5 which may be Pt or other suitable electrode metal is applied. Alternatively, referring to FIG. 1A, this metal layer may be a combination of metallic layers 15, such as a Cr layer 15 at approximately 200 A thick, followed by a Cu layer 16 at approximately 0.5 $\mu$m to 10 $\mu$m thick, a diffusion barrier 17 at approximately 1000 A to 5000 A thick, and a Pt layer 18 at approximately 100 A–2500 A thick. The diffusion barrier prevents oxidation and corrosion of the underlying metalized vias 2, 3, and 4. A TaSiN layer may be used as a diffusion barrier. Such a barrier layer is disclosed by M. Farooq, et al., in co-pending application No. 09/031,236 entitled, "HIGH TEMPERATURE, CONDUCTIVE THIN FILM DIFFUSION BARRIER FOR CERAMIC/METAL SYSTEMS", filed on even date herewith, the disclosure is hereby incorporated by reference. Additionally, Ti layer 19 may be used for adhesion enhancement before and/or after the Pt deposition layer 18. Preferably, the thickness of the Cu layer will be greater than 1000 A. However, more preferably, the thickness of this layer will be greater than 0.5 $\mu$m. Still more preferably the thickness of this layer will be greater than 2 $\mu$m. Further still, a thickness greater than 5 $\mu$m is the most preferred embodiment for the present invention.

Next, a dielectric film 6 is deposited on the blanket metal layer 5, as shown in FIG. 2. An example of a dielectric film is barium titanate (BT), barium strontium titanate (BST), barium zirconate titanate (BZT), lead lanthanum zirconate, lead zirconate titanate, or tantalum oxide. Preferably, this dielectric film may be of a high-dielectric constant material, but, need not have to be in order achieve the advantages of the present invention. The dielectric film is deposited using chemical vapor or plasma vapor deposition to a thickness of approximately 500 A to 3000 A. This process step is then followed by an optimization annealing at a temperature range of approximately 650° C. to 750° C. for one hour in air, oxygen, or nitrogen.

FIG. 3 depicts a first photoresist stencil 13 deposited on top of the dielectric layer 6. Once deposited, the photoresist 13 is patterned, exposing areas over the metalized vias, 2A, 3A, and 4A respectively, for ion beam milling. This initiates the process for forming conductive lines above the vias, through the interposer capacitor structure. The dielectric layer 6 is then removed, preferably by ion beam milling, in these exposed areas. The photoresist is then stripped away (not shown) using wet media e.g., strippers or acetone, or using dry techniques e.g., oxygen/argon ion beam.

A second photoresist 14 is then applied, as shown in FIG. 4. This resist, after patterning, covers portions of the areas 2A, 3A, and 4A, surrounding the vias, and exposes adjacent areas 3B and 4B where insulation for each via is to be subsequently applied. The blank metal layer 5 is then removed, preferably by ion beam milling, in these exposed areas. The resist is then stripped away using wet media, e.g., strippers or acetone, or using dry techniques, e.g., oxygen/argon ion beam.

Figure 5:
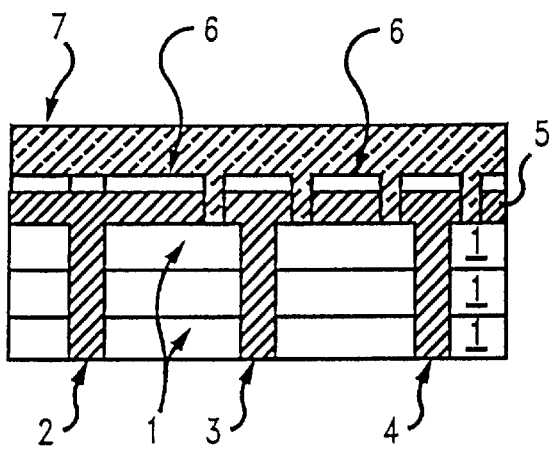
FIG. 5 is a cross-sectional view of the layered substrate of FIG. 4 with a photosensitive polyimide applied.

Referring to FIG. 5, a layer of photosensitive polyimide 7 is then applied to the structure. The application may be performed using spin-on films or other deposition methods. Alternatively, standard non-photosensitive polyimides may be used with patterning methods such as RIE, plasma ash, wet chemical etch, or ion beam milling. However, these non-photosensitive pattern methods will also involve a separate resist process step.

Figure 6:
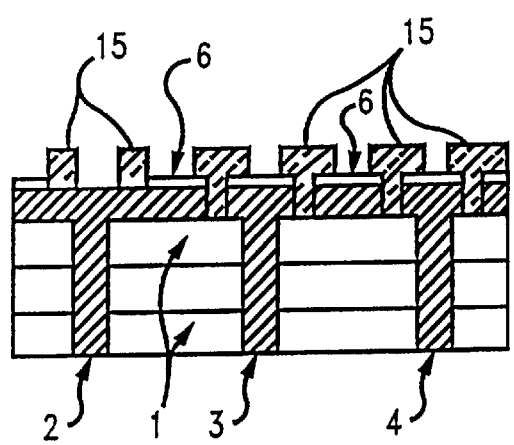
FIG. 6 is a cross-sectional view of the layered substrate of FIG. 5 with the polyimide layer exposed and developed.

Using photolithography, a pattern is created in the polyimide layer 7 to leave areas with polyimide and other areas without as shown in FIG. 6. Once the photosensitive polyimide 7 is exposed and developed, insulation structures 15 of polyimide remain on the structure. These structures border the conductive vias, insulating each via 2, 3, and 4 from one another. Again, an alternative method of patterning may be employed. Standard non-photosensitive polyimides may be used with patterning methods such as RIE, plasma ash, wet chemical etch, or ion beam milling. However, these non-photosensitive pattern methods would again involve a separate resist process step.

Figure 7:
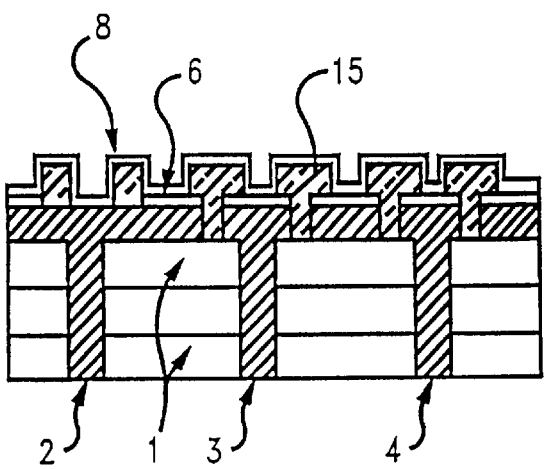
FIG. 7 is a cross-sectional view of the layered substrate of FIG. 6 with a top surface metal seed layer deposited.

Referring to FIG. 7, a blanket top surface metal (TSM) seed layer 8 is deposited on the existing structure. Deposition is performed by using sputtering, plating, evaporation, or other techniques commonly practiced in the prior art. This seed layer is typically comprised of conductive metals. Preferably, the TSM seed layer is made of: Pt of approximately 500 A to 2000 A thick; Cr of approximately 200 A thick; and Cu of approximately 2000 A thick.

Figure 8:
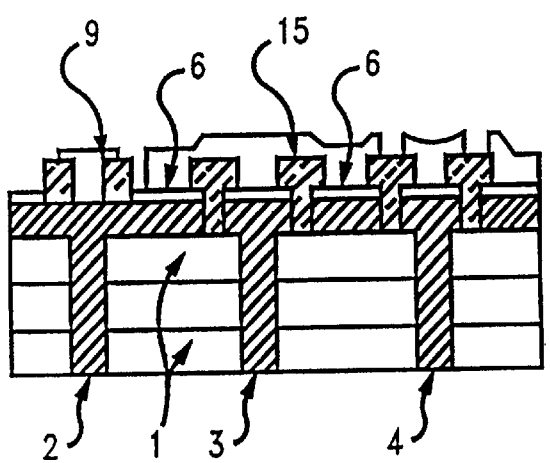
FIG. 8 is a cross-sectional view of the layered substrate of FIG. 7 with patterned electroplated metals deposited.

A resist stencil (not shown) is then created for subsequent electroplating of a resultant TSM metal layer 9 shown in FIG. 8. Top surface metals Cu and Ni are electroplated to form the first segment of the TSM metal layer 9 using the resist stencil, such that portions of TSM layer 9 are electrically connected to vias 2, 3, and 4, but not to each other. This electroplating may also include a layer of Au, although this layer may be applied later in the process. The resultant TSM metal layer 9 extends the vias 2, 3, and 4 outside the ceramic substrate into the thin film region. Each portion of the TSM metal layer 9, electrically connected to individual vias, is partially separated by the polyimide insulation structures 15. Excess Ni may be plated as part of this process step since the Pt removal step (by ion beam milling) that follows will also remove an equivalent amount of Ni. For a 1000 A Pt layer, assuming 100% over-etch, the ion beam process step will remove about 2000 A of Ni. Consequently, excess Ni is necessary in order to compensate for this subtraction.

The exposed Cu and Cr of the underlying seed layer is then removed, preferably by flash etching, from the surface. The remaining Pt and underlying dielectric may be removed, preferably by ion beam milling. Traces of dielectric that are left over, if any, will not create problems since subsequent application of polyimide will fill those areas. Electroless plated Au is then applied to establish the final segment of TSM layer 9, if this layer was not applied during the previous electroplating process step described above.

Figure 9:
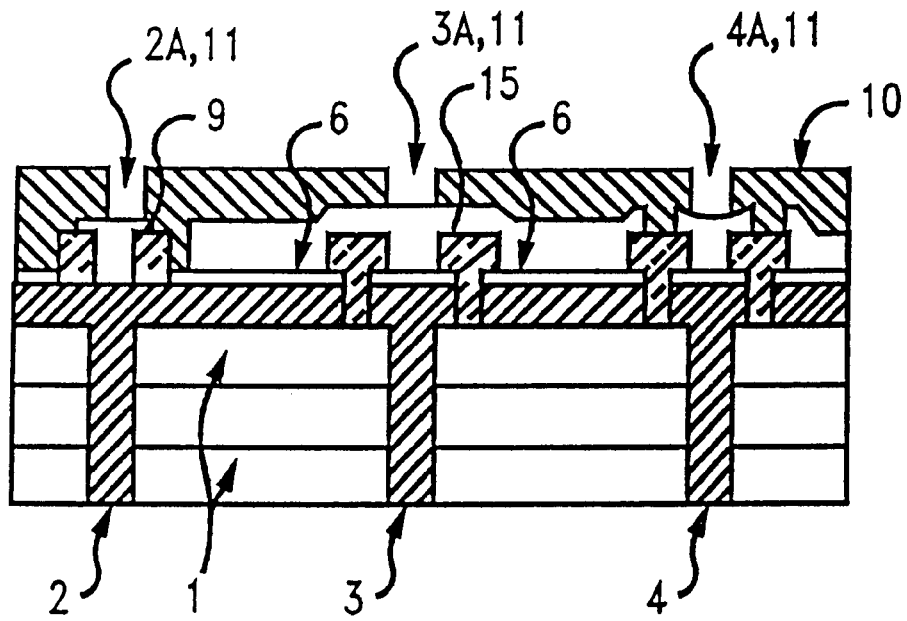
FIG. 9 is a cross-sectional view of the layered substrate of FIG. 8 with a passivation polyimide layer applied, exposed, and developed.

Referring to FIG. 9, a passivation polyimide 10 is applied to the top surface. Openings 11 for C4 solder connections are then laser ablated in the passivation polyimide layer 10, exposing the TSM layer 9 in areas along the vias, 2A, 3A, and 4A. Alternatively, a photosensitive polymer may be used and patterned to create openings 11 for the C4 solder connections.

Figure 10:
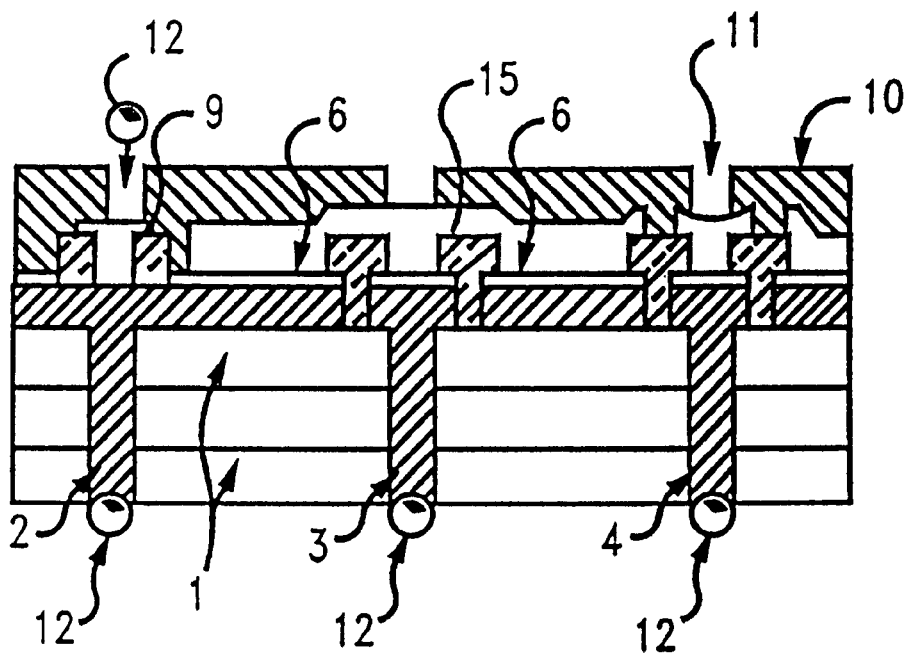
FIG. 10 is a cross-sectional view of the layered substrate of FIG. 9 with solder balls attached to the conductive vias on the bottom surface.

Lastly, SBC or C4 (solder) balls 12 are deposited, as shown in FIG. 10, for joining the interposer capacitor to an underlying substrate. Solder balls may also be used on the top surface of the interposer capacitor, in the areas where the TSM layer is exposed (over the vias). One such solder ball is shown in FIG. 10 over via 2.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for fabricating a thin film multilayer capacitor comprising:

a) providing a multilayer substrate with a top surface, a bottom surface opposite said top surface, and conductive vias between said top and bottom surfaces;

b) depositing a first metal layer on said top surface such that said first metal layer is deposited at a thickness greater than 0.5 $\mu$m;

c) depositing a thin film dielectric on said first metal layer;

d) patterning said thin film dielectric;

e) applying a first patterned polyimide layer such that, when a portion of said patterned polyimide layer is subtracted, polyimide insulation structures remain on said top surface adjacent said conductive vias; and f) depositing a second metal layer.

2. The method of claim 1 further comprising:

g) applying a second patterned polyimide layer;

h) laser ablating said second polyimide layer in areas over said vias; and i) depositing solder balls to the top surface of said multilayer substrate on said exposed vias, and to said bottom surface of said multilayer substrate on said vias.

3. The method of claim 1 wherein said step (b), depositing a first metal layer, further comprises depositing said metal layer 2 $\mu$m or more in thickness.

4. The method of claim 1 wherein said step (b), depositing a first metal layer, further comprises depositing a combination of Cr, Cu, diffusion barrier, and Pt layers.

5. The method of claim 4, depositing a first metal layer, further comprises depositing a combination of Cr at approximately 200 A thick, Cu at approximately 2 to 10 $\mu$m thick, a diffusion barrier at approximately 1000 A–5000 A thick, and Pt at approximately 100 A to 2500 A thick.

6. The method of claim 4, depositing a first metal layer, further includes depositing thin Ti layers for adhesion enhancement, such that said Ti layers are applied either before or after said Pt layer.

7. The method of claim 1, wherein said step (c), depositing a thin film dielectric, further comprises depositing a high k value dielectric.

8. A method for fabricating a thin film multilayer capacitor comprising:

a) providing a multilayer substrate with a top surface, a bottom surface opposite said top surface, and conductive vias between said top and bottom surfaces;

b) depositing a blanket first level metal structure on said top surface at a thickness of at least 0.5 $\mu$m;

c) depositing a thin film dielectric on said first level metal structure;

d) annealing said multilayer substrate including said first level metal structure and said dielectric film;

e) applying a first photoresist stencil over said dielectric film such that said stencil patterns areas over said conductive vias on said top surface of said multilayer substrate;

f) removing a portion of said thin film dielectric and a portion of said first level metal structure in said exposed areas over said conductive vias on said top surface of said multilayer substrate;

g) applying a first patterned polyimide layer such that, when a portion of said patterned polyimide layer is subtracted, polyimide insulation structures remain on said top surface, adjacent said conductive vias;

h) depositing a second level metal structure;

i) removing a portion of said second level metal structure;

j) applying a second polyimide layer;

k) laser ablating said second polyimide layer in areas over said vias; and l) depositing solder balls to the top surface of said multilayer substrate on said exposed vias, and to said bottom surface of said multilayer substrate on said vias.

9. The method of claim 8 wherein said step (a), providing a multilayer substrate, further comprises polishing said substrate to prepare said top surface for thin film deposition.

10. The method of claim 8 wherein said step (b), depositing a first level metal structure, further comprises depositing a metal layer 2 µm or more in thickness.

11. The method of claim 8 wherein said step (b), depositing a first level metal structure, further comprises depositing a combination of Cr, Cu, diffusion barrier, and Pt layers.

12. The method of claim 11, depositing a first level metal structure, further comprises depositing a combination of Cr at approximately 200 A thick, Cu at approximately 2 to 10 µm thick, a diffusion barrier at approximately 1000 A–5000 A thick, and Pt at approximately 100 A to 2500 A thick.

13. The method of claim 11, depositing a first level metal structure, further includes depositing thin Ti layers for adhesion enhancement, such that said Ti layers are applied either before or after said Pt layer.

14. The method of claim 8, wherein said step (c), depositing a thin film dielectric, further comprises depositing a high k value dielectric.

15. The method of claim 8, wherein said step (c), depositing a thin film dielectric, further comprises depositing a dielectric film of barium zirconate titanate (BZT).

16. The method of claim 8, wherein said step (c), depositing a thin film dielectric, further comprises depositing a dielectric film of barium titanate (BT).

17. The method of claim 8, wherein said step (c), depositing a thin film dielectric, further comprises depositing a dielectric film of barium strontium titanate (BST).

18. The method of claim 8, wherein said step (c), depositing a thin film dielectric, further comprises depositing a dielectric film of lead lanthanum zirconate.

19. The method of claim 8, wherein said step (c), depositing a thin film dielectric, further comprises depositing a dielectric film of lead zirconate titanate.

20. The method of claim 8, wherein said step (c), depositing a thin film dielectric, further comprises depositing a dielectric film of tantalum oxide.

21. The method of claim 8, wherein said step (c), depositing a thin film dielectric, further comprises depositing a dielectric film at approximately 500 A to 3000 A thick, using a chemical vapor deposition process or a plasma vapor deposition process.

22. The method of claim 8, wherein said step (d), annealing said multilayer substrate, further comprises annealing in a temperature range of approximately 650° C. to 750° C. for one hour in one of the following atmospheres: air, oxygen, or nitrogen.

23. The method of claim 11, wherein said step (f), removing a portion of said thin film dielectric and a portion of said first level metal structure, further comprises using ion beam milling with said first photoresist stencil as a mask such that said dielectric, said Pt layer, and said diffusion barrier are removed.

24. The method of claim 23, wherein said photoresist is stripped away using a wet media including strippers or acetone.

25. The method of claim 23, wherein said photoresist is stripped away using a dry media including $O_2$ or Ar ion beam milling.

26. The method of claim 8, wherein said step (g), applying a patterned polyimide layer, comprises using a second photoresist stencil such that, when exposed and developed, said second photoresist stencil exposes areas adjacent said conductive vias.

27. The method of claim 8, wherein said step (g), applying a patterned polyimide layer, comprises using a photosensitive polyimide to pattern said polyimide layer.

28. The method of claim 8, wherein said step (g), applying a patterned polyimide layer, comprises using a non-photosensitive polyimide and a separate resist process.

29. The method of claim 28, wherein said separate resist process comprises patterning methods including RIE, plasma ash, wet chemical etch, or ion beam milling.

30. The method of claim 8, wherein said step (h), depositing a second level metal structure, comprises:

1) depositing a top surface metal (TSM) seed layer;
2) applying a resist stencil to pattern said seed layer; and
3) electroplating a metal layer on areas exposed by said resist stencil of step (2).

31. The method of claim 30, wherein depositing said TSM seed layer comprises using sputtering or evaporation techniques.

32. The method of claim 30, wherein said step (1), depositing a top surface metal (TSM) seed layer, said TSM seed layer comprises Pt, Cr, and Cu layers.

33. The method of claim 30, wherein said step (3), electroplating a metal layer, comprises electroplating Cu and Ni layers.

34. The method of claim 30, wherein said step (i), removing a portion of said second level metal structure, comprises applying a patterned resist stencil over said TSM seed layer, flash etching said Cu and Cr layers, and ion beam milling said Pt layer, all of said TSM seed layer.

35. The method of claim 34, wherein said step (i), removing a portion of said second level metal structure, further comprises applying an electroless plated Au layer to said TSM seed layer.

36. The method of claim 30, wherein said step (3), electroplating a metal layer, comprises plating Cu, Ni, and Au layers.

* * * * *